(12) United States Patent
Chang

(10) Patent No.: US 7,468,888 B2
(45) Date of Patent: Dec. 23, 2008

(54) HEATSINK ASSEMBLY STRUCTURE

(75) Inventor: Kai-Po Chang, Taipei (TW)

(73) Assignee: Inventec Corporation, Taipei (TW)

( * ) Notice: Subject to any disclaimer, the term of this patent is extended or adjusted under 35 U.S.C. 154(b) by 197 days.

(21) Appl. No.: 11/704,334

(22) Filed: Feb. 9, 2007

(65) Prior Publication Data

US 2008/0192438 A1    Aug. 14, 2008

(51) Int. Cl.
*H05K 7/20* (2006.01)
*F28F 7/00* (2006.01)
*H01L 23/34* (2006.01)

(52) U.S. Cl. .................. 361/719; 361/704; 361/709; 361/711; 165/80.2; 165/185; 174/16.3; 257/718

(58) Field of Classification Search .................. 361/704, 361/709, 711, 719; 165/80.2, 185; 174/16.1, 174/16.3; 257/718–719
See application file for complete search history.

(56) References Cited

U.S. PATENT DOCUMENTS

| | | | | |
|---|---|---|---|---|
| 6,239,974 B1 * | 5/2001 | Tseng | .................. | 361/704 |
| 6,449,157 B1 * | 9/2002 | Chu | .................. | 361/704 |
| 7,019,976 B1 * | 3/2006 | Ahmad et al. | ............... | 361/704 |
| 7,072,184 B2 * | 7/2006 | Kalyandurg | ................ | 361/704 |
| 2008/0128899 A1 * | 6/2008 | Mlotkowski | ................ | 257/719 |

* cited by examiner

*Primary Examiner*—Jayprakash N Gandhi
*Assistant Examiner*—Zachary M Pape
(74) *Attorney, Agent, or Firm*—Rabin & Berdo, P.C.

(57) ABSTRACT

A heatsink assembly structure is provided. The heatsink assembly structure includes a heat conducting board attached to a heat-generating element, pressing members fixed to the heat conducting board, and spring plates penetrating through the heat conducting board. A plurality of through holes symmetric about the heat-generating element is formed in the heat conducting board in pairs. Two ends of the spring plates penetrate through the through holes, and are fixed to the pressing members between the through holes. When the spring plates are fixed to the circuit board, the spring plates apply forces that pull the heat conducting board towards the circuit board at positions of the pressing members, so as to push the heat conducting board against the heat-generating element to conduct heat to the heat conducting board. Thus, a plurality of forces pressing the heat conducting board downward is provided with a simple structure.

12 Claims, 3 Drawing Sheets

HEATSINK ASSEMBLY STRUCTURE

BACKGROUND OF THE INVENTION

1. Field of Invention

The present invention relates to a heatsink assembly structure, and more particularly to a heatsink assembly structure that provides normal pressing forces with a simple combined structure and is attached to a heat-generating element stably and tightly.

2. Related Art

A chip unit providing operation and main control functions of a computer, e.g., a central processor unit (CPU), is a core of the computer, and is very important to the computer. The chip unit or another module such as the display chip module may generate a lot of heat when operating at high frequencies, so they are heat-generating elements of the computer. The high temperature is a potential risk leading to the breakdown of the computer system, and further causes the computer down or damage. Therefore, heatsink devices are proposed to solve the aforementioned problem. The current heatsink method that has been widely applied uses a heatsink device fixed to the mainboard of the computer to dissipate heat. According to the conventional fixing technology, four holes corresponding to the heat-generating element are opened in the mainboard at the position where the heatsink device is fixed, so as to provide four normal forces. Thus, the heatsink device is attached and firmly fixed to the heat-generating element.

However, along with the trend of miniaturization of notebook computers, the mainboards are becoming smaller accordingly. Therefore, to a heatsink device, the position and number of the fixing holes are also limited. In particular, to a chip unit, the preferred fixing method is to open several holes at corners around the chip unit. When the above method is not applicable, fewer holes (e.g., three holes) must be used to firmly fix the heatsink device, which causes troubles.

In order to solve the problem that the heatsink device cannot be fixed to the mainboard with fewer holes in the conventional art, it is an object for the inventor of the present invention to redesign a heatsink assembly structure meeting the current trend of being light in weight and small in size of notebook computers and capable of providing normal forces with fewer holes than the conventional art so as to firmly fix the heatsink device to the mainboard.

SUMMARY OF THE INVENTION

In view of the aforementioned problem of the conventional art, the present invention provides a heatsink assembly structure to solve the problem that a heatsink device cannot be fixed to a mainboard with fewer holes in the conventional art, and to solve the problem how to firmly fix the heatsink device with three holes.

In order to achieve the aforementioned object, the present invention provides a heatsink assembly structure combined with a heat-generating element that produces heat disposed on a circuit board. The heatsink assembly structure comprises a heat conducting board attached to the heat-generating element, a plurality of pressing members fixed to the heat conducting board, and a plurality of spring plates penetrating through the heat conducting board. The heat conducting board has fixing ends fixed to the circuit board, a plurality of through holes in pairs symmetric about the heat-generating element is formed in the heat conducting board, and the pressing members are fixed at position between the through holes in pairs. Moreover, two ends of the spring plates respectively penetrate the through holes in pairs and are fixed to the pressing members between the through holes. When the spring plates are fixed to the circuit board with the central portions of the spring plates, the spring plates generate pulling forces towards the circuit board at positions of the pressing members, so as to push the heat conducting board against the heat-generating element and conduct heat to the heat conducting board.

The present invention is a heatsink assembly structure, which has the following significant functional effect as compared with the conventional art.

The heatsink assembly structure of the present invention combines components such as heat conducting boards, spring plates, and pressing members easily, and provides normal pressing forces with fewer holes, for example, three holes. Thus, the heat conducting board can be stably and firmly attached to the heat-generating element to conduct heat. The present invention is suitable for current circuit boards with limited space that does not allow more fixing holes, and is in conformity with the trend that notebook computers are manufactured smaller and smaller.

To make the objectives, structure, features, and functions of the present invention more understandable, the present invention is illustrated below in detail with reference to the embodiments and the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
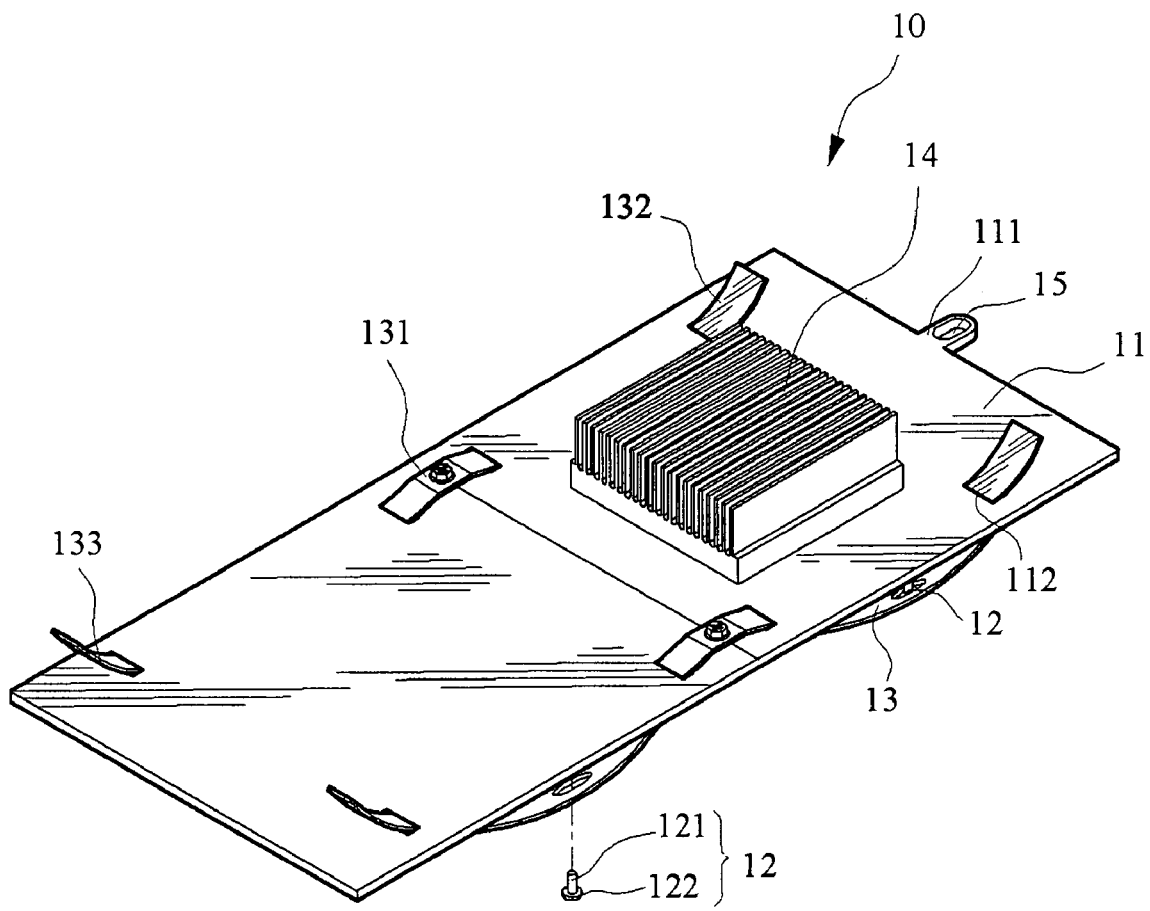
FIG. 1 is a schematic view of an assembled heatsink assembly structure of the present invention.
Figure 2A:
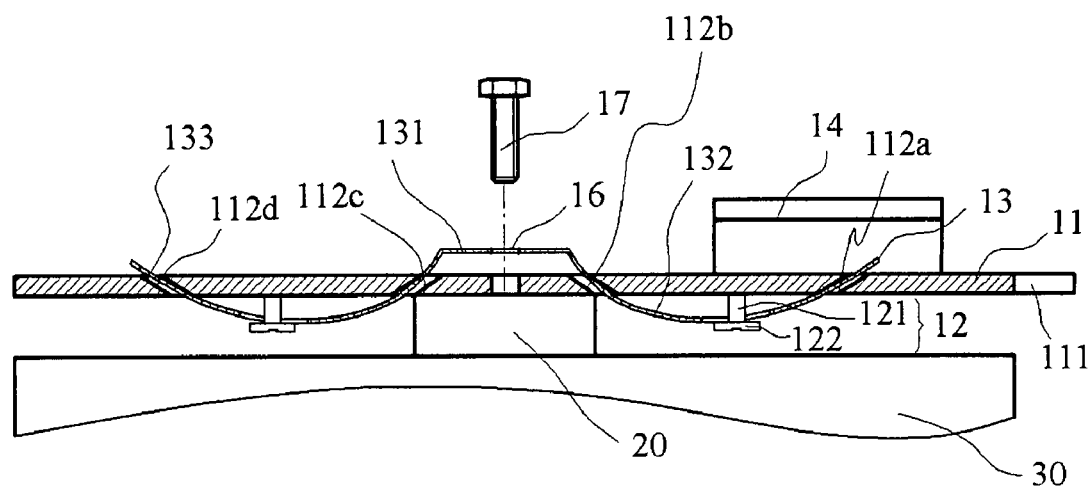
FIGS. 2A and 2B are schematic views of the actuation of a heatsink assembly structure combined to a heat-generating element according to the present invention.

Referring to FIGS. 1 and 2A, the present invention relates to a heatsink assembly structure. The heatsink assembly structure 10 is disposed on a heat-generating element 20 that produces heat and is disposed on a circuit board 30. The heat-generating element 20 is a chip, such as a CPU or a display chip, which generates a lot of heat in operation. The generated heat must be dissipated effectively to maintain the stable operation of the heat-generating element 20. Furthermore, the heatsink assembly structure 10 includes a heat conducting board 11, a plurality of pressing members 12, a plurality of spring plates 13, and a heatsink module 14. The heat conducting board 11 is attached to the heat-generating element 20, and conducts the heat generated by the heat-generating element 20 to the heat conducting board 11. The heat conducting board 11 further includes a fixing end 111 for being fixed to the circuit board 30. A fixing hole 15 is formed in the fixing end 111, so as to fix the heat conducting board 11 to the circuit board 30 through the fixing hole 15, for example, by screwing. In addition, a plurality of through holes 112 symmetric about the heat-generating element 20 is formed in the heat conducting board 11 in pairs. In this embodiment, four pairs of the through holes 112 are symmetrically arranged on two sides of the heat-generating element 20, and are arranged in straight lines.

Moreover, the plurality of pressing members 12 is respectively fixed to the heat conducting board 11 and located on between the heat conducting board 11 and the circuit board 30, and are fixed at positions between the through holes in pairs 112. Therefore, the height of the pressing members 12 must be designed to be smaller than the space between the heat conducting board 11 and the circuit board 30, so as to prevent the problem of blocking. In addition, the pressing member 12 further includes a combining portion 121 fixed to the heat conducting board 11 and a head portion 122 extending from the combining portion 121. In this embodiment, four pressing members 12 such as rivets in an inverted T shape are fixed to the heat conducting board 11.

Moreover, the plurality of spring plates 13 is double-arch shaped, and two ends of the spring plates 13 penetrate through the through holes in pairs 112 and the pressing members 12 respectively. The pressing members 12 can move relative to the heat conducting board 11, so as to adjust the space in-between (for example, the pressing members can be implemented as screws, which can be screwed in or out to adjust the space). When the pressing members 12 are locked into the heat conducting board 11, the pressing forces to the spring plate 13 increases, so as to adjust the forces that the spring plates 13 urge and pull the heat conducting board 11 towards the circuit board 30 (as described below), thereby achieving the adjustment. In this embodiment, two spring plates 13 are disclosed. Each of the two spring plates 13 has a central portion 131 and a front portion 132 and a rear portion 133 extending from the central portion 131. As shown in FIG. 2A, the front portion 132 penetrates through the two through holes 112a, 112b on the right of the figure. In order to illustrate the present invention more clearly, the through holes 112a, 112b are marked in FIG. 2A to distinguish the through holes 112, while only the through holes 112 are marked in other figures. Similarly, the rear portion 133 also penetrates through the through holes 112c, 112d on the left of the figure. Therefore, after the front portion 132 and the rear portion 133 penetrate through two through holes 112 of the eight through holes 112 respectively, the front portion 132 and the rear portion 133 are on different surfaces or opposite surfaces of the heat conducting board 11 with respect to the central portion 131. That is to say, the central portion 131 of one of the spring plates 13 is on a same side with four through holes 112, and is arranged at the central position of the four through holes 112 in a straight line. As described above, the through holes in pairs 112 through which two ends of one of the two spring plates 13 penetrate are disposed correspondingly.

Figure 2B:
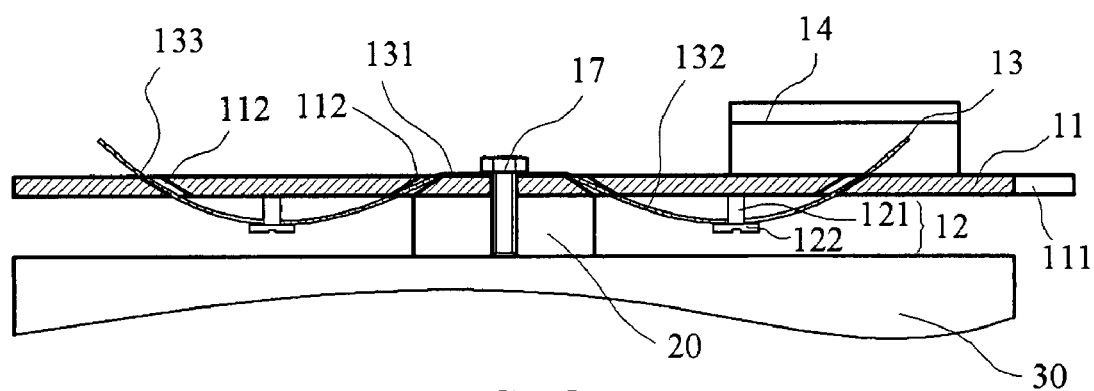
Figure 3:
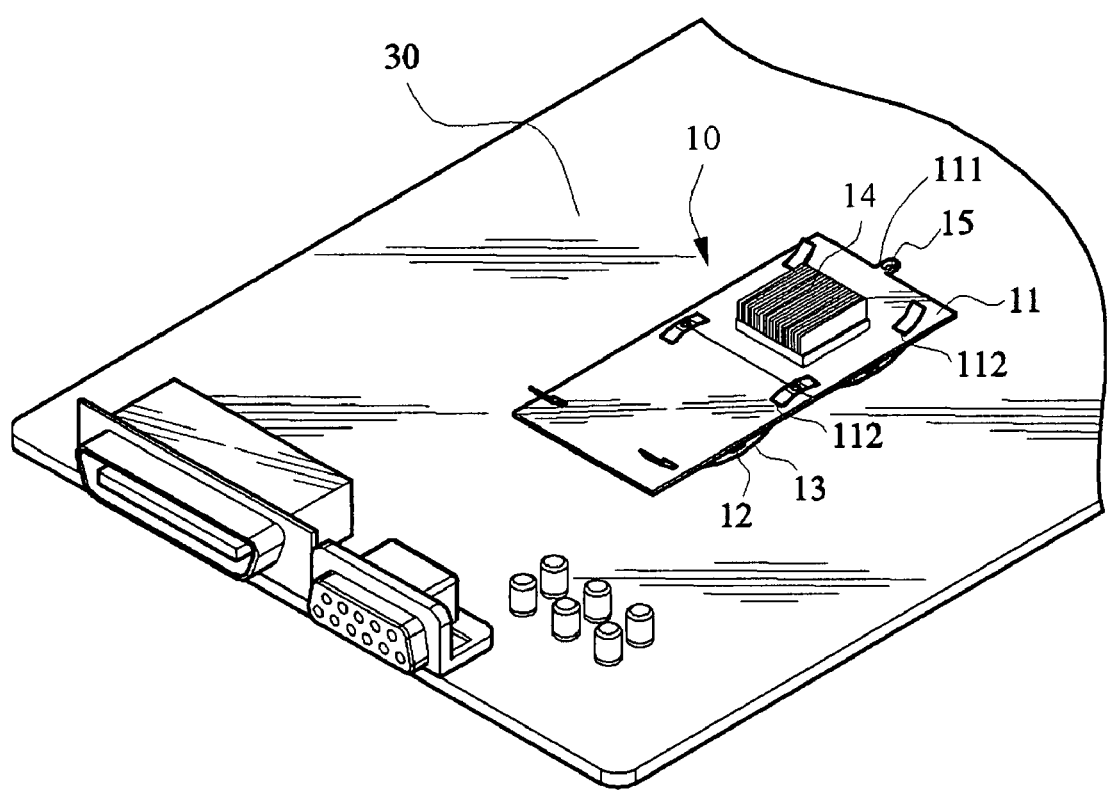
FIG. 3 is a schematic view of a heatsink assembly structure combined with a heat-generating element of a circuit board according to the present invention.

Referring to FIGS. 2A, 2B, and 3, after the heatsink assembly is assembled, the heatsink assembly structure 10 is combined with the heat-generating element 20 on the circuit board 30. At this time, in addition to fixing the heat conducting board 11 to the circuit board 30 through the fixing holes 15, the central portions 131 of the spring plates 13 are also used to fix the spring plates 13 to the circuit board 30. In this embodiment, a penetrating hole 16 that penetrates through the heat conducting board 11 is formed in the central portion 131 of the spring plates 13, and a screw 17 is used to screw the spring plate 13 on the circuit board 30. At this time, the spring plates 13 generate pulling forces towards the circuit board 30 at the positions of the pressing members 12. That is to say, the spring plates 13 press against the head portions 122, and the spring plates 13 generate forces that pull the heat conducting board 11 towards the circuit board 30. Thus, the heat conducting board 11 is pushed against the heat-generating element 20 to conduct the generated heat, and the heatsink module 14 disposed on the heat conducting board 11 is used to dissipate the heat conducted by the heat conducting board 11. Accordingly, the temperature of the heat-generating element 20 is reduced effectively to maintain the stable operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink assembly structure, combined with a heat-generating element, wherein the heat-generating element is disposed on a circuit board and produces heat, the heatsink assembly structure comprising:

a heat conducting board, attached to the heat-generating element and conducting the heat to the heat conducting board, wherein the heat conducting board comprises a fixing end fixed to the circuit board, and a plurality of through holes symmetric about the heat-generating element is formed in the heat conducting board in pairs;

a plurality of pressing members, fixed to the heat conducting board and disposed between the heat conducting board and the circuit board, wherein the pressing members are fixed at positions between the through holes in pairs; and a plurality of spring plates, with two ends respectively penetrating through the through holes in pairs, and fixed to the pressing members between the through holes, such that when the spring plates are fixed to the circuit board with central portions of the spring plates, the spring plates generate pulling forces towards the circuit board at positions of the pressing members, so as to push the heat conducting board against the heat-generating element.

2. The heatsink assembly structure as claimed in claim 1, further comprising a heatsink module disposed on the heat conducting board for dissipating the heat conducted by the heat conducting board.

3. The heatsink assembly structure as claimed in claim 1, wherein the pressing member comprises a combining portion and a head portion extending from the combining portion, the pressing member is fixed to the heat conducting board through the combining portion, and the spring plate is pressed against the head portion to generate the pulling force towards the circuit board.

4. The heatsink assembly structure as claimed in claim 1, wherein a height of the pressing member is smaller than a space between the heat conducting board and the circuit board.

5. The heatsink assembly structure as claimed in claim 1, wherein the pressing member is in an inverted T shape.

6. The heatsink assembly structure as claimed in claim 5, wherein the pressing member is a rivet.

7. The heatsink assembly structure as claimed in claim 1, wherein the through holes in pairs for two ends of one of the spring plates to penetrate through is arranged correspondingly.

8. The heatsink assembly structure as claimed in claim 1, wherein the spring plates are double-arch shaped, and penetrate through the through holes in pairs in the heat conducting board.

9. The heatsink assembly structure as claimed in claim 1, wherein the fixing end of the heat conducting board further has a fixing hole for an end of the heat conducting board to be fixed to the circuit board.

10. The heatsink assembly structure as claimed in claim 1, wherein the fixing end of the heat conducting board is screwed on the circuit board.

11. The heatsink assembly structure as claimed in claim 1, comprising two spring plates and eight through holes, wherein the eight through holes are symmetrically arranged on two sides of the heat-generating element in straight lines, and the spring plates are fixed to the circuit board with the central portions of the spring plates aligned with central positions of the four through holes arranged in a straight line on a same side.

12. A heatsink assembly structure, combined with a heat-generating element, wherein the heat-generating element is disposed on a circuit board and produces heat, the heatsink assembly structure comprising:

a heat conducting board, attached to the heat-generating element and conducting the heat to the heat conducting board, wherein the heat conducting board has a fixing hole at a fixing end for screwing the heat conducting board to the circuit board, eight through holes are opened in the heat conducting board in pairs, and the eight through holes are symmetrically arranged on two sides of the heat-generating element in straight lines;

a heatsink module, disposed on the heat conducting board for dissipating the heat conducted by the heat conducting board;

four rivets, respectively fixed to the heat conducting board between the heat conducting board and the circuit board, wherein the rivets are in an inverted T shape and have a height smaller than a space between the heat conducting board and the circuit plate, the rivets are fixed at positions between the through holes in pairs, each of the rivets has a combining portion and a head portion extending from the combining portion, and the rivet is fixed to the heat conducting board through the combining portion thereof; and two spring plates, being double-arch shaped, wherein two ends of the spring plates penetrates through the four through holes in pairs, and fixed to the pressing member between the through holes, the through holes in pairs for two ends of one of the spring plates to penetrate through is arranged correspondingly, when the spring plates are fixed to the circuit board with central portions of the spring plates, the spring plates are pressed against the head portion and generate pulling forces towards the circuit board at positions of the pressing members, so as to push the heat conducting board against the heat-generating element, and the spring plates are fixed to the circuit board with the central portions of the spring plates aligned with central positions of the four through holes arranged in a straight line on a same side.

\* \* \* \* \*